(12) United States Patent
Kull et al.

(10) Patent No.: US 9,041,573 B2
(45) Date of Patent: May 26, 2015

(54) SAMPLING DEVICE WITH BUFFER CIRCUIT FOR HIGH-SPEED ADCS

(71) Applicant: International Business Machines Corporation, Armonk, NY (US)

(72) Inventors: Lukas Kull, Zurich (CH); Thomas H Toifl, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/217,710

(22) Filed: Mar. 18, 2014

(65) Prior Publication Data

US 2014/0292551 A1 Oct. 2, 2014

(30) Foreign Application Priority Data

Mar. 26, 2013 (GB) .................................. 1305473.9

(51) Int. Cl.
*H03M 1/00* (2006.01)
*H03M 1/12* (2006.01)
*H03M 1/68* (2006.01)

(52) U.S. Cl.
CPC .............. *H03M 1/121* (2013.01); *H03M 1/685* (2013.01)

(58) Field of Classification Search
CPC . H03M 1/662; H03M 1/1009; H03M 1/1245; H03M 9/00; H03M 1/125; H03M 1/42
USPC .......................................... 341/155, 141, 156
See application file for complete search history.

(56) References Cited

U.S. PATENT DOCUMENTS

| | | | |
|---|---|---|---|
| 5,745,394 A * | 4/1998 | Tani ............................ | 708/313 |
| 6,160,508 A | 12/2000 | Gustavsson et al. | |
| 7,132,965 B2 | 11/2006 | Gupta et al. | |
| 7,219,174 B2 * | 5/2007 | Gerlach et al. ................ | 710/65 |
| 8,248,289 B2 | 8/2012 | Bright et al. | |

(Continued)

FOREIGN PATENT DOCUMENTS

| EP | 2347509 B1 | 12/2012 |
|---|---|---|
| WO | WO 2009/090514 A1 | 7/2009 |

OTHER PUBLICATIONS

Van Der Plas et al., "A 0.16PJ/Conversion-Step 2.5MW 1.25GS/S 4B ADC in a 90NM Digital CMOS Process", Solid-State Circuits Conference, Feb. 6, 2006, ISSCC 2006, Digest of Technical Papers, IEEE International.

(Continued)

*Primary Examiner* — Jean B Jeanglaude
(74) *Attorney, Agent, or Firm* — Jeff Tang

(57) ABSTRACT

A sampling and interleaving stage device for use in an analog-digital-converter and for providing a sampling output signal and an analog-to-digital-converter. The sampling and interleaving stage device for use in an analog-digital-converter, including: a receiving unit having a clock unit with a plurality of clock-driven switches for receiving an input signal; for each of the plurality of clock-driven switches, a first demultiplexer, for receiving the input signal via a clock-driven switch and for providing a number of first demultiplexer outputs; for a first demultiplexer output, at least one storage element for a stored input potential depending on the input signal; and an output demultiplexer for receiving an indication about the stored input potential and for outputting a corresponding sampling output signal to a respective sampling output.

9 Claims, 6 Drawing Sheets

(56) References Cited

U.S. PATENT DOCUMENTS

| | | | |
|---|---|---|---|
| 8,350,740 | B2 | 1/2013 | Akita |
| 8,350,743 | B2 | 1/2013 | Van De Vel et al. |
| 8,487,795 | B1 | 7/2013 | Jiang et al. |
| 2010/0253414 | A1 | 10/2010 | Dedic et al. |
| 2012/0309337 | A1 | 12/2012 | Zhu et al. |
| 2013/0015990 | A1 | 1/2013 | Payne et al. |

OTHER PUBLICATIONS

Wei-Hsuan Tu et al., "A 1.2V 30MW 8B 800MS/S Time-Interleaved ADC in 65NM CMOS", VLSI Circuits, Jun. 18, 2008, pp. 72-73, IEEE Symposium on VLSI Circuits.

Alpman, E., "A 1.1V 50MW 2.5GS/S 7B Time-Interleaved C-2C SAR ADC in 45NM LP Digital CMOS", Solid-State Circuits Conference—Digest of Technical Papers, Feb. 8, 2009, pp. 76-77, 77a, ISSCC 2009, IEEE International.

Verbruggen, B., "A 2.6MW 6B 2.2GS/S 4-Times Interleaved Fully Dynamic Pipelined ADC in 40NM Digital CMOS", Solid-State Circuits Conference Digest of Technical Papers (ISSCC), Feb. 7-11, 2010, pp. 296-297, 2010 IEEE International.

Tousi, Y. M. et al., "A Miniature 2 MW 4 Bit 1.2 GS/S Delay-Line-Based ADC in 65 NM CMOS", IEEE Journal of Solid-State Circuits, Oct. 2011, pp. 2312-2325, vol. 46, Issue 10.

\* cited by examiner

SAMPLING DEVICE WITH BUFFER CIRCUIT FOR HIGH-SPEED ADCS

CROSS-REFERENCE TO RELATED APPLICATION

This application claims priority under 35 U.S.C. §119 from Patent Application No. GB1305473.9 filed Mar. 26, 2013, the entire contents of which are incorporated herein by reference.

BACKGROUND OF THE INVENTION

1. Field of the Invention

The present invention relates to high-performance sampling and interleaving stages for high-speed analog-to-digital converters, in particular, for analog-to-digital converters operating at sampling frequencies of several tens of GS/s.

2. Description of the Related Art

Analog-to-digital converters (ADCs) can be implemented with different topologies. Technological restrictions, however, generally require interleaving of the input signal for high-speed ADCs, in particular at sampling rates beyond 20 GS/s. Due to the high requirements on bandwidth, precision and speed, sampling stages are often implemented in semiconductor processes such as SiGe or other high-performance processes. In order to achieve full system integration, the ADC preferably has to be fully integrated on a CMOS chip, which means that the interleaving and sampling stage has to be implemented in CMOS as well.

ADCs of this kind usually have a sampling and interleaving stage for receiving and distributing the input signal to be converted. The sampling and interleaving stage is therefore substantial for the performance of the ADC and is particularly responsive for bandwidth linearity and noise.

In an interleaved ADC, there generally is an ADC sub-stage in which the voltage of the input signal is stored on a capacitor. The ADC sub-stages are then connected to the capacitor of the sampling and interleaving stage by means of a buffer. The buffer must provide high linearity, low power and very high speed in order to enable high sampling bandwidths. The sampling and interleaving stage directly receives the input signal and is responsible for providing the input signal to the respective capacitor with a high linearity and high bandwidth and should further allow for a good skew calibration at low jitter.

U.S. Pat. No. 8,350,743 B2 discloses a sample-and-hold circuit, an analog-to-digital converter and switches that enable selectable ones of the outputs of a differential amplifier in the sample-and-hold circuit to be coupled to a circuit node of the analog-to-digital converter. The switches can be controlled such that the output of the differential amplifier can be reset without requiring an additional switch between the outputs of the differential amplifier.

U.S. Patent Application Publication No. 2013/0015990 A1 discloses a track-and-hold architecture with a tunable bandwidth. A track-and-hold circuit architecture is provided that uses a variation of the gate voltage of a sampling switch to vary the ON resistance of the sampling switch and thus change the bandwidth of the track-and-hold circuit to precisely match the bandwidth.

U.S. Pat. No. 8,248,289 B2 discloses track-and-hold circuits as parts of an analog-to-digital converter. By means of a multiplexer controlled by a clocking circuit the coupling between each of the track-and-hold circuits and the analog-to-digital converter is controlled.

European Patent No. 2,347,509 B1 discloses a time-interleaved analog-to-digital converter, wherein a track-and-hold unit is used for supplying the input signals to each of a plurality of analog-to-digital converting elements. The track-and-hold units to supply the input signal to one or more of the analog-to-digital converting elements have an improved linearity and can be fully implemented in CMOS technology.

U.S. Patent Application Publication No. 2012/0309337 A1 discloses a multi-layer interleaved analog-to-digital converter for receiving radio frequency signals.

U.S. Patent Application Publication No. 2010/0253414 A1 discloses a device for sampling a current signal in high-speed applications, in particular for use in analog-to-digital converting circuitries.

Van der Plas, G. et al., "A 0.16PJ/CONVERSION-STEP 2.5 MW 1.25GS/S 4 B ADC IN A 90 NM DIGITAL CMOS PROCESS", Solid-State Circuits Conference, 2006. ISSCC 2006. Digest of Technical Papers. IEEE International, Feb. 6-9, 2006, discloses a high-speed ADC in CMOS that uses a dynamic offset-compensation scheme in its comparators.

Wei-Hsuan Tu et al., "A 1.2V 30 MW 8 B 800 MS/S TIME-INTERLEAVED ADC IN 65 NM CMOS", IEEE Symposium on VLSI Circuits, 2008 Author(s): Pages 72-73, is related to a time-interleaved pipeline ADC high-speed input. It shows sub-ADC preamp sharing and reference voltage buffer current-reusing to minimize power consumption.

Furthermore, Alpman, E., "A 1.1V 50 MW 2.5GS/S 7 B TIME-INTERLEAVED C-2C SAR ADC IN 45 NM LP DIGITAL CMOS", Solid-State Circuits Conference—Digest of Technical Papers, 2009, ISSCC 2009, IEEE International, Feb. 8-12, 2009, pages 76-77, 77a, discloses a time-interleaved successive approximation register-based (SAR) ADC that achieves high performance by using a small-area C-2C SAR architecture with low input capacitance, high-speed boosted switches to overcome a high device threshold, background comparator offset calibration and radix calibration; and redundant-ADC-based gain, offset and timing calibration to reduce errors.

Moreover, Verbruggen, B., "A 2.6 MW 6 B 2.2GS/S 4-TIMES INTERLEAVED FULLY DYNAMIC PIPELINED ADC IN 40 NM DIGITAL CMOS", Solid-State Circuits Conference Digest of Technical Papers (ISSCC), 2010 IEEE International, Feb. 7-11, 2010, pages 296-297, is related to a 2.2 GS/s interleaved ADC in CMOS, wherein each ADC slice consists of a 1b folding stage followed by a pipelined binary-search sub-ADC using dynamic nonlinear amplifiers for low power consumption and high speed. Threshold calibration corrects for amplifier and comparator imperfections.

Tousi, Y. M. et al., "A MINIATURE 2 MW 4 BIT 1.2 GS/S DELAY-LINE-BASED ADC IN 65 NM CMOS", IEEE Journal of Solid-State Circuits, October 2011, Volume: 46, Issue 10, pages 2312-2325, describes a delay line-based analog-to-digital converter for high-speed applications. The ADC converts the sampled input voltage to a delay that controls the propagation velocity of a digital pulse. The output digital code is generated based on the propagation length of the pulse in a fixed time window.

BRIEF SUMMARY OF THE INVENTION

The present invention provides a sampling and interleaving stage device for use in an analog-digital-converter and for providing a sampling output signal, including: a receiving unit having a clock unit with a plurality of clock-driven switches for receiving an input signal; for each of the plurality of clock-driven switches, a first demultiplexer, for receiving the input signal via a clock-driven switch and for providing a number of first demultiplexer outputs; for a first demultiplexer output, at least one storage element for a stored input potential depending on the input signal; and an output demultiplexer for receiving an indication about the stored input potential and for outputting a corresponding sampling output signal to a respective sampling output.

Another aspect of the present invention provides an analog-to-digital-converter including: a sampling and interleaving stage device, wherein a receiving unit having a clock unit with a plurality of clock-driven switches for receiving an input signal, wherein for each of the plurality of clock-driven switches, a first demultiplexer, for receiving the input signal via a clock-driven switch and for providing a number of first demultiplexer outputs, wherein for a first demultiplexer output, at least one storage element for a stored input potential depending on the input signal, and wherein, an output demultiplexer for receiving an indication about the stored input potential and for outputting a corresponding sampling output signal to a respective sampling output; and a number of analog-to-digital converting substages, each of which is connected to one of the outputs of the output demultiplexer.

DETAILED DESCRIPTION OF THE PREFERRED EMBODIMENTS

Figure 1:
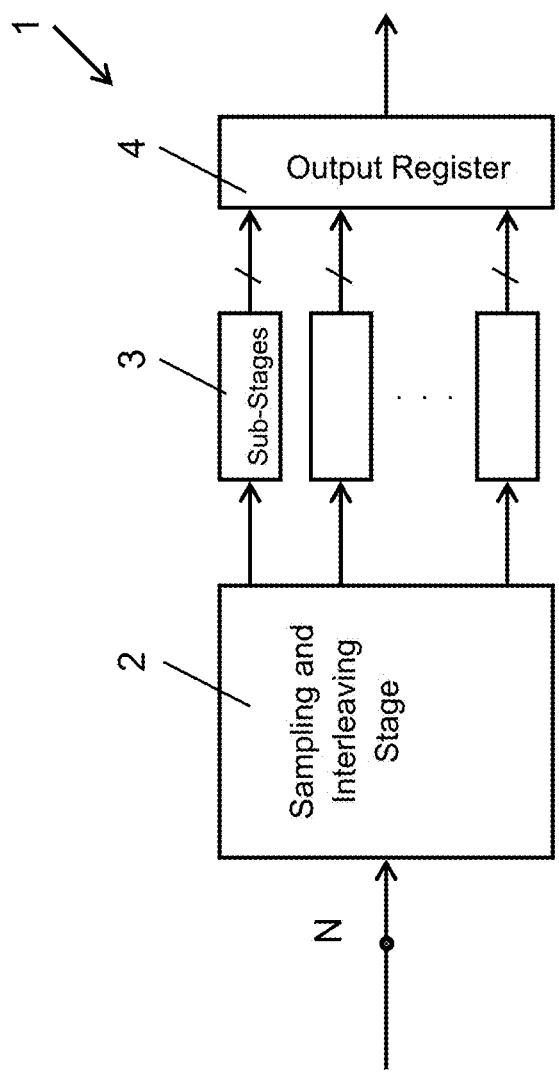
FIG. 1 schematically shows an analog-to-digital converter having a sampling and interleaving stage according to embodiments of the present invention.

According to an embodiment of a first aspect, a sampling and interleaving stage for use in an analog-digital-converter and for providing a sampling output signal is provided, including: a receiving unit having a plurality of clock-driven switches for receiving an input signal; for each of the clock-driven switches, a first demultiplexer for receiving the input signal via the clock-driven switch and for providing a number of first demultiplexer outputs; for each of the first demultiplexer outputs, at least one storage element for storing an input potential depending on the input signal; and an output demultiplexer for receiving an indication about the stored input potential and for outputting the sampling output signal to a respective sampling output.

The present invention provides a sampling and interleaving stage with a cascaded architecture, wherein a number of clock-driven switches are coupled to receive an input signal, serially followed by at least one demultiplexer, each of which can include a number of enable switches to form a tree structure to distribute the input signal level to a number of storage elements, such as capacitors, for holding the input signal level at a specific point of time.

This architecture of a sampling and interleaving stage for use in an analog-to-digital converter allows for a higher bandwidth, good linearity and low noise and can be implemented in CMOS technology. In particular, the input capacitance is kept relatively low in order to achieve the high input bandwidth.

Furthermore, buffer circuits can be provided between the storage elements and the associated (respective) output demultiplexer. Hence, the input potential stored in the storage element is buffered and an indication of the buffered input potential is provided via the output demultiplexer to a respective sampling output. It can be provided that one or more of the buffer circuits include a source follower.

One or more further demultiplexers can be arranged between the first demultiplexer and the storage element in a cascaded manner.

The first and output demultiplexers each include a number of switches coupled between their inputs and each of their outputs which are controlled to successively forward their input to one of their outputs. In particular, each of the switches of the first and output demultiplexers includes an NMOS and/or PMOS transistor.

Moreover, the storage elements can be formed by capacitors each of which is coupled between the output of the first demultiplexer and a reference potential, in particular a ground potential, or each of which is coupled in series between the output of the first demultiplexer and the input of the output demultiplexer.

According to an embodiment of the present invention, an analog-digital-converter is provided including the above-mentioned sampling and interleaving stage and a number of analog-digital converting sub-stages, each of which is connected to one of the outputs of the output demultiplexer.

Moreover, a control unit can be provided which controls the first demultiplexer such that the input potential is fed to only one, two or a few storage elements at a time.

Embodiments of the present invention will now be described below with reference to the accompanying drawings. In the following description, elements that are identical are referenced by the same reference numbers in all the drawings unless noted otherwise. The configurations explained here are provided as preferred embodiments, and it should be understood that the technical scope of the present invention is not intended to be limited to these embodiments.

FIG. 1 shows a schematic block diagram of an analog-to-digital converter 1 (ADC) having a sampling and interleaving stage 2 and a plurality of ADC sub-stages 3 connected thereto. The sampling and interleaving stage 2 is connected to an input node N at which an input signal is applied. Preferably, the input signal is differential, so that the circuitry of the sampling and interleaving stage 2 is provided twice (doubled) in order to provide differential sampled signals to the ADC sub-stages 3. Substantially, the sampling and interleaving stage 2 stores a voltage potential, e. g. with reference to a ground potential, in a storage element, such as a capacitor, and provides a respective sampling voltage to the associated ADC sub-stage 3 according to a respective enable signal.

The digitally converted input signal levels (voltage levels) at the outputs of the plurality of ADC sub-stages 3 are buffered, e.g. in an output register 4.

Figure 2:
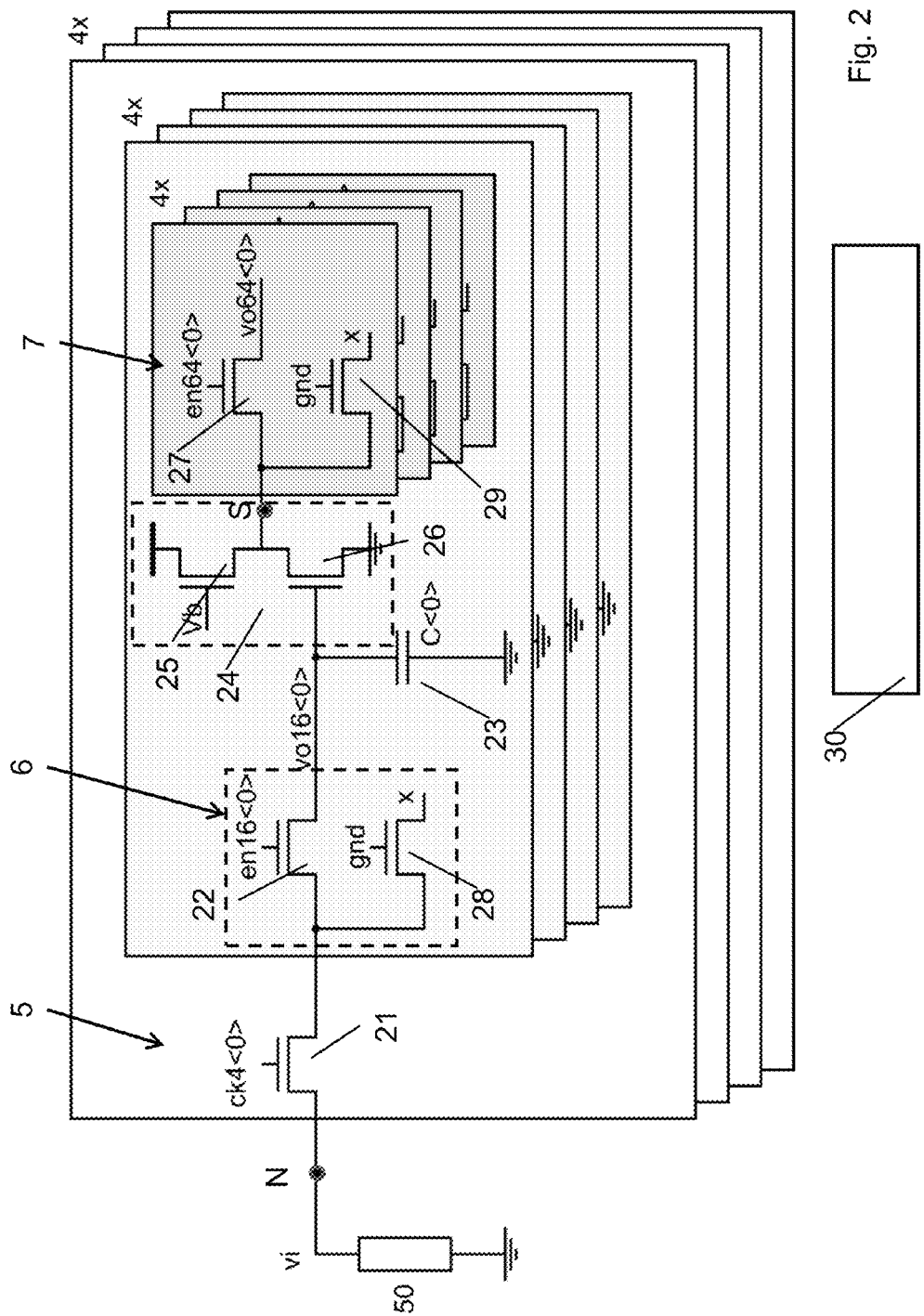
FIG. 2 shows a schematic diagram of an exemplary sampling and interleaving stage for use in 64 ADC sub-stages according to embodiments of the present invention.
Figure 3:
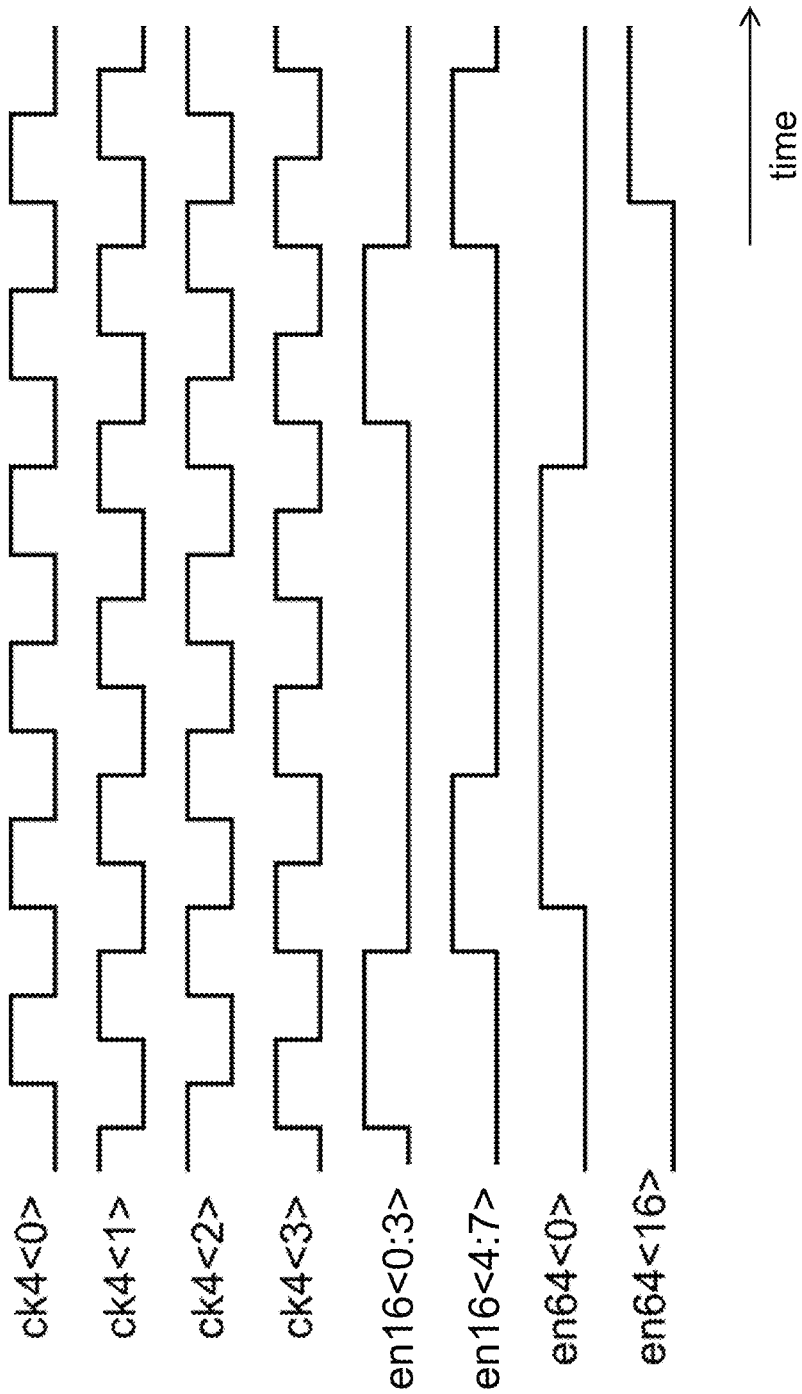
FIG. 3 shows a signal-time diagram indicating the characteristics of the clock signal and the enable signals for an embodiment of the present invention shown in FIG. 2.

In FIG. 2, a schematic diagram of an exemplary sampling and interleaving stage 2 is shown in more detail. FIG. 2 illustrates a sampling and interleaving stage 2 for providing the input signal voltage level to 64 ADC sub-stages 3 in an interleaved manner. Firstly, the input signal is fed to first terminals of a clock unit 5 with a number n of clock-driven switches 21. In an embodiment of the present invention, the number n of the clock-driven switches 21 is 4. The clock-driven switches 21 are controlled by clock signals ck4<0:3> which are phase-shifted to form a quadrature clock, as illustrated in FIG. 3. Any other numbers, such as 2, 3, 5 or more, of clock-driven switches 21 can be applied.

Serially connected to each of the clock-driven switches 21 are a number of first enabling switches 22 which form a demultiplexer 6. In detail, the second terminal of each clock-driven switch 21 is connected to first terminals of the first enabling switches 22. The first enabling switches 22 are controlled by a respective first enabling signal en16<0:15> which is for selecting a respective charge storage element that is implemented in the embodiment of the present invention as a capacitor 23. The first terminals of each capacitor 23 are connected to a second terminal of the associated first enabling switch 22 and the second terminals of the capacitors 23 are connected to the ground potential GND. At the first terminals of the capacitors 23, a respective stored potential vo16<0:15> is provided. Since four first enabling switches 22 are provided for each of the clock-driven switches 21 in the present case, a total of 16 capacitors 23 are used in the present embodiment.

As shown in FIG. 3, in the first enabling signals en16<0:15> are spaced equally with a time spacing of tsmp, where tsmp is the time between two acquired samples. Furthermore, the signals en16<0:15> have a periodicity of 4 clock cycles and are phase-shifted by 22.5° towards each other. The periodicity corresponds to the number of clock-driven switches 21 used and the first enabling signal level closing the controlled first enabling switch 22 has a length/duration of at least the length/duration of the high-level of the clock signals ck4<0:3>.

Furthermore, the second terminals of the first enabling switches 22, respectively the first terminals of each capacitor 23, are connected to an associated buffer circuit 24 to supply the stored potential vo16<0:15> to the buffer circuit 24.

The buffer circuit 24 can preferably be provided as a source follower 24. In the present case, the source follower 24 is implemented as a series connection of two source follower transistors 25, 26, wherein the first terminal of a first source follower transistor 25 is connected to a high supply potential VDD and a second terminal to a sampling node S and wherein a second source follower transistor 26 is provided whose first terminal is connected to the sampling node S and whose second terminal is connected to the ground potential GND.

The first source follower transistor 25 of the source follower 24 is controlled by means of a bias voltage VB provided as a constant control voltage to keep the current through the source follower 24 at a constant level.

The sampling nodes S are connected to a corresponding number of output demultiplexers 7, each of which has 4 output enabling switches 27. The first terminals of the output enabling switches 27 are connected to the sampling node S and the second terminals of the output enabling switches 27 are connected to the ADC sub-stage input node for feeding the sampling output signal vo64<0:63> of the respective sampling node S to one respective ADC sub-stage 3.

Furthermore, the enabling switches, i. e. the first enabling switches 22 and the output enabling switches 27, are coupled with cross-coupled transistors 28, 29, respectively. First terminals of the cross-coupled transistors 28, 29 are coupled with the first terminals of the respective enabling transistors while the second terminals of the cross-coupled transistors 28, 29 are coupled with the second terminals of the corresponding second terminals of the enabling switches 22, 27 of the other differential branch of the sampling and interleaving stage 2, indicated by x. This allows for differential feedthrough cancellation.

The output enabling switches 27 are controlled by output enabling signals en64<0:63>. The clock signals CK4<0:3>, the first enabling signals en16<0:15> and the output enabling signals en64<0:63> are generated as shown in the signal-time diagram of FIG. 3.

Due to the series connection of the clock-driven switches 21 and the first enabling switches 22, only the clock-driven switches 21 have to be controlled by clock signals CK4<0:3>, which can be generated with a high precision. The time controls for the enabling signals EN16<0:15> and EN64<0:63> are more relaxed as they do not have essential influence on the sampling timing.

Each of the switches 21, 22, 25, 26, 27, 28, 29 of the sampling and interleaving stage 2 can be implemented as an NMOS and/or PMOS transistor, so that the entire ADC circuit can be fully implemented in CMOS logic.

Figure 4:
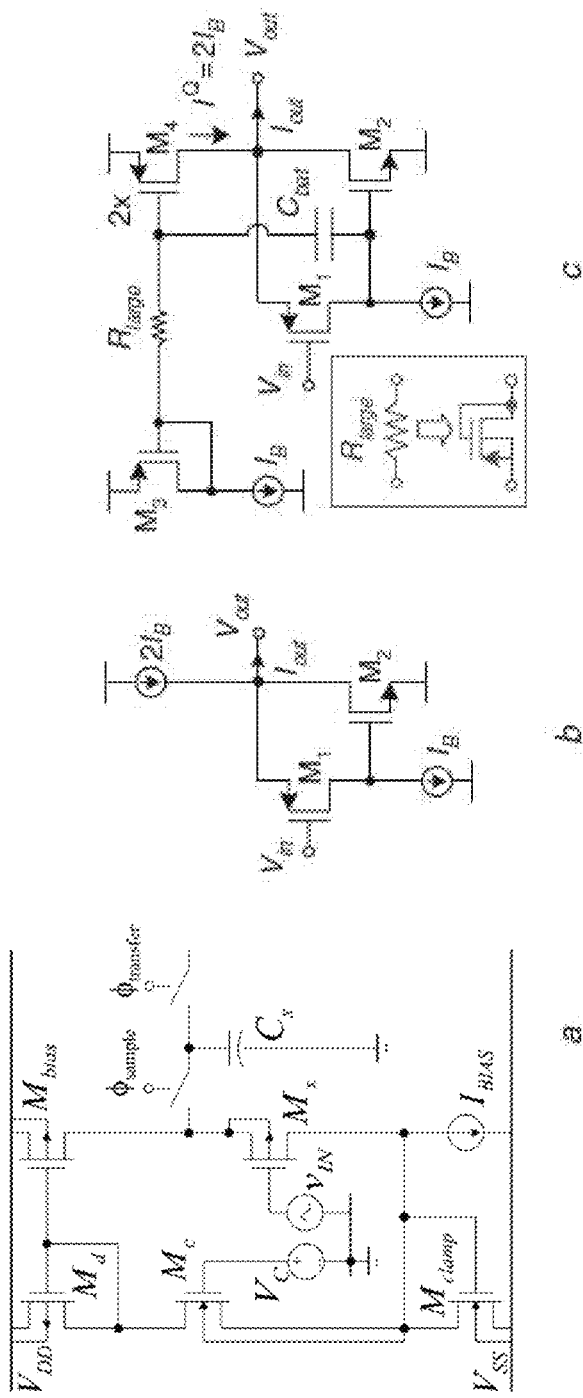
FIGS. 4a, 4b, and 4c show embodiments of the present invention for an alternative implementation of buffer circuits.

In FIGS. 4a, 4b and 4c, different alternatives for implementing the source follower 24 are shown according to embodiments of the present invention, which are known in the art and therefore not described in detail herein. While the source follower 24 used as a buffer circuit according to FIG. 2 has a very simple design, the source followers 24 of FIGS. 4a and 4c provide different implementations of source followers which can similarly act as a buffer circuit for the respective capacitor 23. In other words, the source follower 24 has a function to decouple the capacitor 23 from the output demultiplexer 7, in order to reduce the overall capacitance provided by the gate source capacitance of the input of the source follower 24, i. e. the gate source capacity of the second source follower transistor 26 of the source follower 24, and the capacitor 23, as experienced by the input signal. The shown source follower circuits correspond to the Rapakko type source follower (FIG. 4a), a class A super source follower (FIG. 4b), and a class AB super source follower (FIG. 4c), as described in more detail in the corresponding literature.

Figure 5:
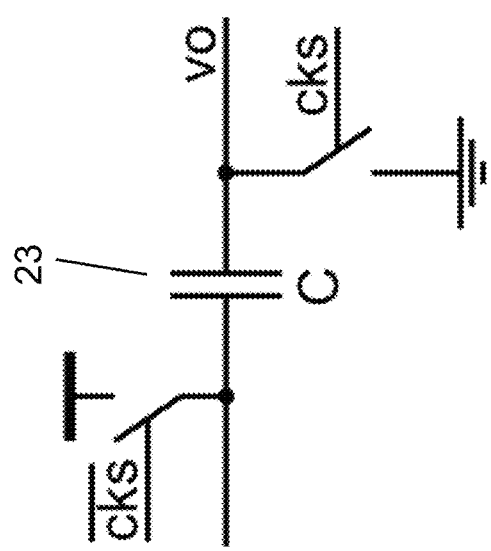
FIG. 5 shows an implementation of the capacitor as a storage element according to an embodiment of the present invention.

As shown in FIG. 5, the capacitor 23 as the storage element coupled between the second terminal of the first enabling switch 22 and the ground potential GND can be replaced by a serially connected capacitor 23' which is connected in series between the second node of the first enabling switches 22 and the respective input node of the source follower 24, respectively. In order to reset these capacitors 23', additional switches to the high supply potential VDD and the ground potential GND are provided in order to discharge the respective capacitor 23. The serially connected capacitor 23' allows for a more linear characteristic of the sampling and interleaving stage 2 and for shifting a common mode.

Figure 6:
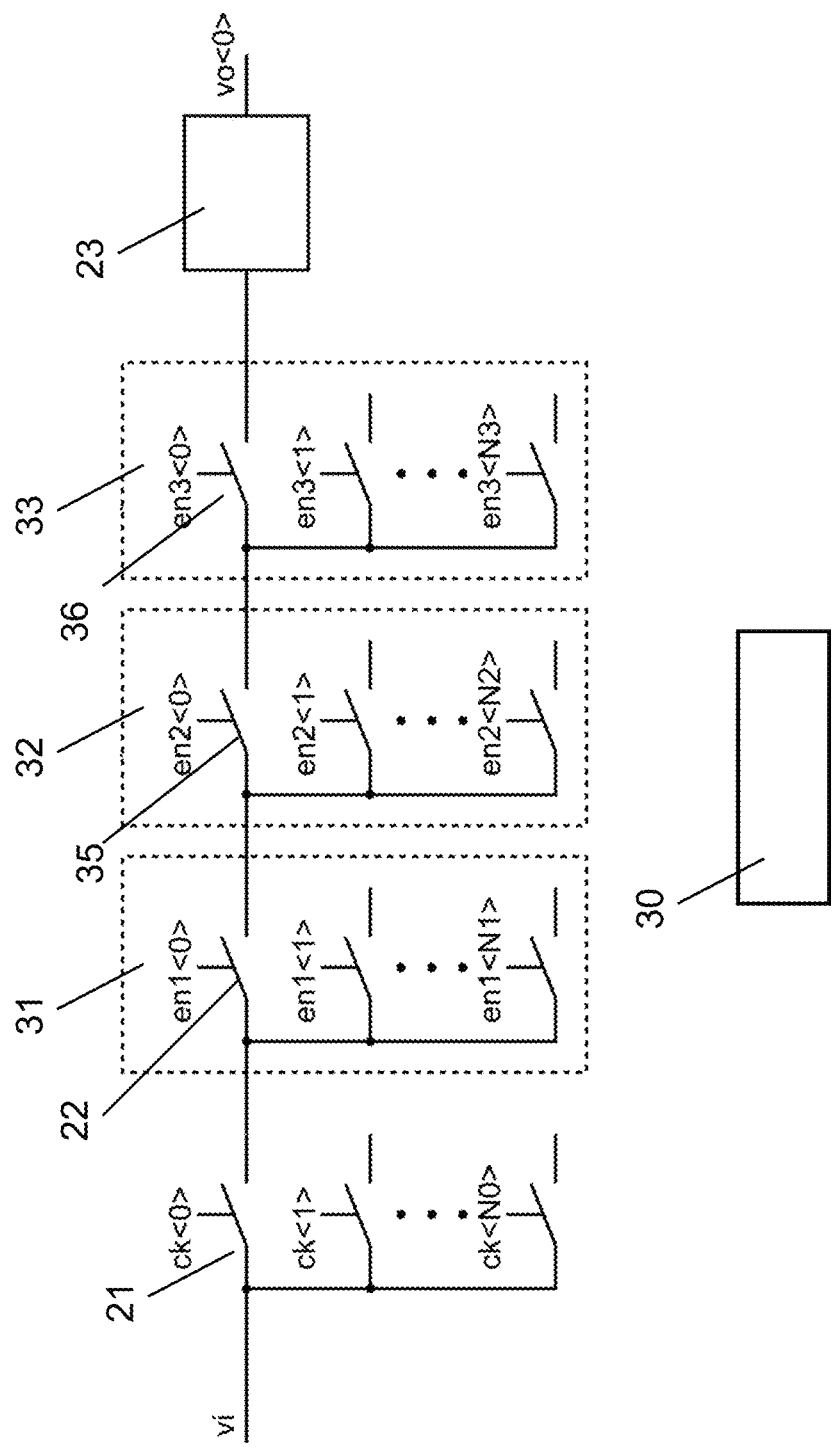
FIG. 6 shows a schematic diagram of a generalized sampling and interleaving stage to be used in the analog-to-digital converter of FIG. 1 according to embodiments of the present invention.

FIG. 6 shows a more general schematic diagram of another sampling and interleaving stage 2 having the clock-driven switches 21 of the clock unit 5 and one or more cascaded sub-stages of demultiplexers, each including enabling switches, i. e. a number N1 of first enabling switches 22 of the first demultiplexer 31, a number N2 of second enabling switches 35 of a second demultiplexer 32 and a number N3 of third enabling switches 36 of a third multiplexer 33, respectively. A tree structure can thus be implemented which has a low capacity and thereby allows for a high bandwidth.

The enabling signals en1, en2, en3 for the first, second and third enabling switches, respectively, can be provided by a control unit 30 which controls the switching of the enabling switches 22, 35, 36 such that these are switched only while the associated clock signal ck which respectively control the clock driven switches 21 is low. Therefore, only the clock signals ck determine the sampling window and are therefore jitter and skew critical. This allows for having relaxed signal accuracy for the enabling signals as compared to the clock signal.

More generally, while the present invention has been described with reference to certain embodiments, it will be understood by those skilled in the art that various changes can be made and equivalents may be substituted without departing from the scope of the present invention. In addition, many modifications may be made to adapt a particular situation to the teachings of the present invention without departing from its scope. Therefore, it is intended that the present invention not be limited to the particular embodiments disclosed, but that the present invention will include all embodiments falling within the scope of the appended claims.

What is claimed is:

1. A sampling and interleaving stage device for use in an analog-digital-converter and for providing a sampling output signal, comprising:
    a receiving unit having a clock unit with a plurality of clock-driven switches for receiving an input signal;
    for each of the plurality of clock-driven switches, a first demultiplexer, for receiving the input signal via a clock-driven switch and for providing a number of first demultiplexer outputs;
    for a first demultiplexer output, at least one storage element for a stored input potential depending on the input signal; and
    an output demultiplexer for receiving an indication about the stored input potential and for outputting a corresponding sampling output signal to a respective sampling output;
    wherein between each of a storage element and a respective output demultiplexer a buffer circuit is provided.

2. The sampling and interleaving stage device according to claim 1, wherein a storage element is formed by capacitors, each of which is coupled in series between an output of the first demultiplexer and the input of the output demultiplexer.

3. The sampling and interleaving stage device according to claim 1, wherein the buffer circuit comprises: a source follower.

4. The sampling and interleaving stage device according to claim 1, wherein at least one demultiplexer is provided between the first demultiplexer and the storage element in a cascaded manner, respectively.

5. The sampling and interleaving stage device according to claim 1, wherein the first demultiplexer and the output demultiplexer comprise:
    a number of switches coupled between the input signal and the corresponding sampling output signal thereof.

6. The sampling and interleaving stage device according to claim 5, wherein the number of switches comprises: an NMOS and/or PMOS transistor.

7. The sampling and interleaving stage device according to claim 1, wherein a storage element is formed by capacitors, each of which is coupled between an output of the first demultiplexer and a reference potential, in particular a ground potential.

8. An analog-to-digital-converter comprising:
    a sampling and interleaving stage device:
    wherein the sampling and interleaving state device comprises a receiving unit having a clock unit with a plurality of clock-driven switches for receiving an input signal;
    wherein for each of the plurality of clock-driven switches, a first demultiplexer for receiving the input signal via a clock-driven switch and for providing a number of first demultiplexer outputs;
    wherein for a first demultiplexer output, at least one storage element for a stored input potential depending on the input signal;
    wherein, an output demultiplexer for receiving an indication about the stored input potential and for outputting a corresponding sampling output signal to a respective sampling output; and
    wherein between each of a storage element and a respective output demultiplexer a buffer circuit is provided; and
    a number of analog-to-digital converting substages, each of which is connected to one of the outputs of the output demultiplexer.

9. The analog-to-digital-converter according to claim 8, wherein a control unit is provided which is configured to control the first demultiplexer such that the stored input potential is fed to one or more storage elements.

* * * * *